United States Patent [19]

Metz

[11] Patent Number: 4,755,766

[45] Date of Patent: Jul. 5, 1988

[54] DIFFERENTIAL TO SINGLE-ENDED CONVERTER

[75] Inventor: Arthur J. Metz, Gervais, Oreg.

[73] Assignee: Tektronix, Inc., Beaverton, Oreg.

[21] Appl. No.: 41,382

[22] Filed: Apr. 22, 1987

[51] Int. Cl.[4] .............................................. H03F 3/45

[52] U.S. Cl. .................................... 330/257; 330/301; 330/260

[58] Field of Search ............... 330/252, 256, 257, 258, 330/260, 261, 301, 311

[56] References Cited

U.S. PATENT DOCUMENTS 4,661,780 4/1987 Siligoni et al. .................. 330/311 X

*Primary Examiner*—Eugene R. LaRoche

*Assistant Examiner*—Steven J. Mottola

*Attorney, Agent, or Firm*—Mark L. Becker

[57] ABSTRACT

A differential to a single-ended converter circuit includes linearizing PN junctions that compensate for input signal voltage loss in the input stage. A variable voltage source and a resistor are provided for adjusting the voltage produced across these junctions by varying the current through these junctions. The converter circuit also includes a shunt feedback amplifier for inverting half the differential output voltage so that it sums with the differential voltage of opposite phase to produce the single-ended output signal. The shunt feedback amplifier is operated at a constant current to minimize error voltages. Bootstrapping is employed to linearize thermal distortion of the PN junctions and means are provided for compensating for the resulting thermal distortion.

9 Claims, 3 Drawing Sheets

VCC
R4
Q8
Q1
R5
Q5
Q6
IM +IDO
R2
IM−IDO
R3
Q9
Q3
VLIN
Q4
Q12
VB
ILIN
VOUT
IO
R9
R10
12
14
Q2
VIN
−VIN
R1
VREF
Q11
Q10
R8
R6
R7
VEE

VCC
R4
R5
VCC
Q7
VCC
R11
Q5
Q6A
Q6B
R12
Q13
R13
Q14
IM +IDO
R2
IM−IDO
R3
VCC
Q9
Q3
VLIN
Q4
Q12
VOUT
VB
VB
Q1
R9
R10
Q2
12
14
+VIN
−VIN
R1
VREF
Q11
Q10
R8
R6
R7
VEE
VEE

DIFFERENTIAL TO SINGLE-ENDED CONVERTER

TECHNICAL FIELD

This invention relates generally to high speed differential to single-ended converter circuits and more particularly to means for improving the linearity and minimizing the power consumption of such circuits.

BACKGROUND OF THE INVENTION

Differential to single-ended converter circuits receive a differential signal composed of two input signals and convert the input signals to a single-ended output signal. Such circuits find application in the output stages of analog integrated circuits wherever a differential signal must be converted to a single-ended signal. For example, a differential amplifier that provides signals to an analog-to-digital converter would include a converter circuit as an output stage because analog-to-digital converters are typically designed to receive only single-ended signals.

Prior high speed converter circuits have a number of drawbacks. For one, they fail to maintain a linear relationship of output to input signal when the output signal voltage is measured relative to ground. For another, they tend to consume an undesirable amount of power to achieve linearity. Nonlinearity develops because of signal loss across PN junctions in the input stage and because of thermal distortion caused by the heating and cooling of such junctions during circuit operation. The undesirable power consumption arises from the increased standing current through the PN junctions required to improve linearity and from the increased gain needed in converting the signal. Typically, the output signal in conventional converters is measured with respect to ground and is proportional to only one of the input signals. In effect, half of the differential output signal is discarded. This loss in signal is compensated for by increasing the overall gain of the converter circuit, but at the cost of the increased power consumption. The additional power dissipated in turn causes more heating of the integrated circuit and increases the thermal distortion.

SUMMARY OF THE INVENTION

An object of the invention, therefore, is to provide a differential to single-ended converter circuit that compensates for the nonlinear signal losses and for thermal distortion.

Another object of the invention is to provide such a circuit that minimizes power consumption by utilizing both phases of the differential output signal to produce a single-ended output voltage referenced to ground.

In accordance with the present invention, a differential to a single-ended converter circuit is provided with linearizing PN junctions matched to PN junctions of the input stage to cause the output signal to vary linearly with the input signal. The PN junctions produce a voltage to compensate for input signal voltage that is lost across the PN junctions within the differential input stage. Means are also provided for adjusting the compensating voltage produced across the PN junctions by varying the standing current through these junctions. The gain or transfer function of the converter circuit therefore can be adjusted to be compressive, linear, or expansive.

The converter circuit also includes means for bootstrapping the linearizing PN junctions so that thermal distortion generated by self-heating of junctions varies linearly with the input signal. A thermal compensation means responds to the input signal to generate thermal distortion that compensates for the thermal distortion of the PN junctions. The compensation means may be used to provide compensation for other sources of thermal distortion within the circuit as well.

The converter circuit includes amplifier means for converting the differential input voltages to differential output currents which are coupled through common base stages. One common base stage is coupled to an inverting shunt feedback amplifier to invert half the output voltage so that it sums with the output voltage of opposite phase. The difference portion of the input signals is therefore added to produce the output signal and the common portion of the input signals is therefore rejected from the output signal.

The foregoing and other objects, features, and advantages of the invention will become more apparent from the following detailed description of preferred embodiments which proceed with reference to the accompanying drawings.

DETAILED DESCRIPTION

Figure 1:
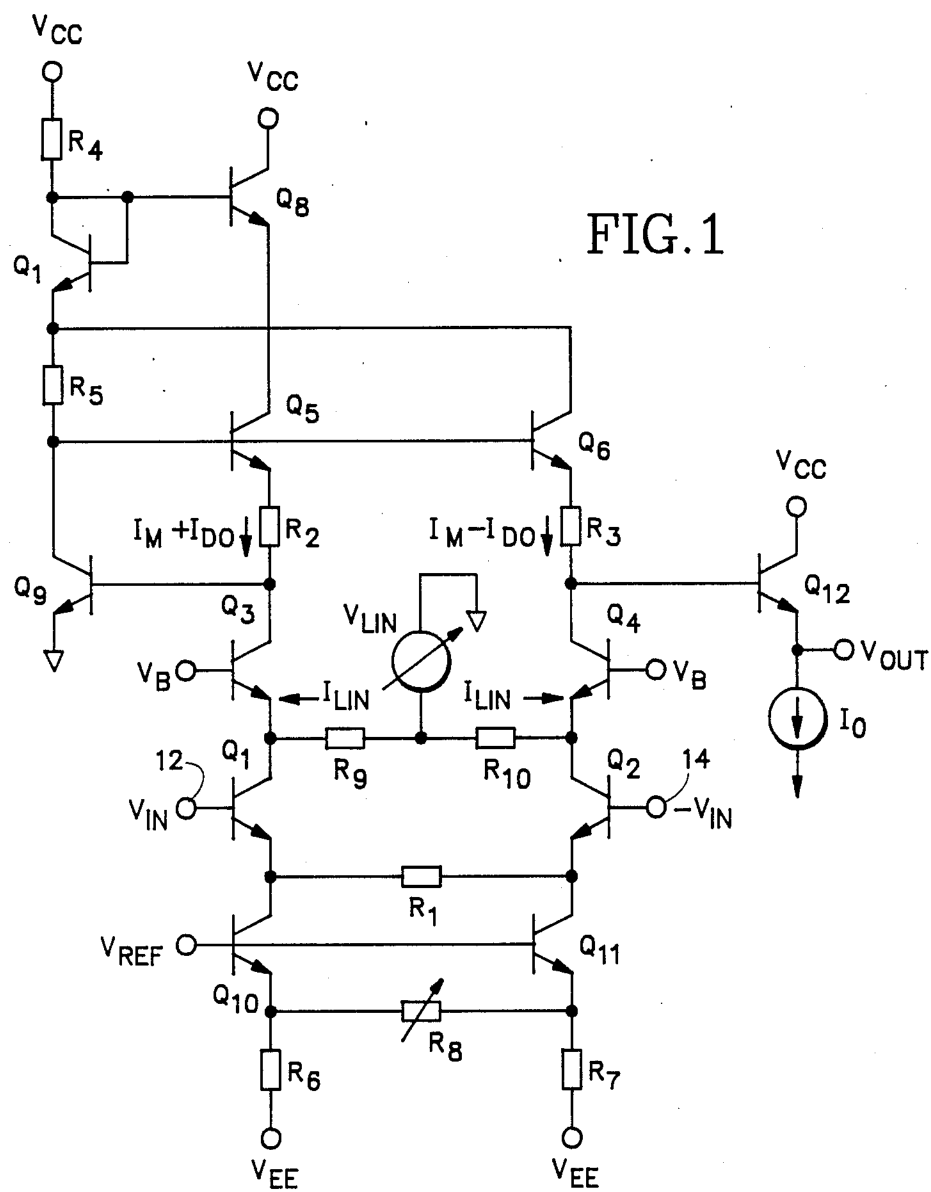
FIG. 1 is a schematic diagram of a differential to single-ended converter in accordance with the present invention.

Referring now to FIG. 1 of the drawings, there is shown a differential to single-ended converter circuit according to the invention. The circuit comprises a number of stages for converting a differential signal composed of two opposite phase input signals into a single-ended output signal. Through these stages the output signal, whose voltage is measured with respect to ground, is linearly related to the difference between the input signals. A differential input stage of the converter circuit comprises a pair of opposed transistors $Q_1$ and $Q_2$ whose emitters are coupled together through a resistor $R_1$. The emitters of transistors $Q_1$ and $Q_2$ are also each coupled to a current source stage comprising transistors $Q_{10}$, $Q_{11}$, current setting resistors $R_6$ and $R_7$, and a negative voltage source $V_{EE}$. Transistors $Q_{10}$, $Q_{11}$ provide the necessary standing or quiescent current $I_M$ for each of the transistors $Q_1$ and $Q_2$, respectively. The base of transistor $Q_1$ is connected to an input 12 of the input stage to which an input signal voltage $+V_{IN}$ is applied; similarly, the base of transistor $Q_2$ is connected to an input terminal 14 to which an input signal $-V_{IN}$ is applied. Thus, $+V_{IN}$ and $-V_{IN}$ constitute the differential input signal, herein a voltage. The differential signal voltage is applied across the base-emitter junctions of transistors $Q_1$, $Q_2$ and across resistor $R_1$, producing differential output currents $+I_{DO}$ and $-I_{DO}$. The total current in each collector path of transistors $Q_1$ and $Q_2$ thus equals the standing current $I_M$ and the differential currents $+I_{DO}$ or $-I_{DO}$ as indicated in FIG. 1.

Coupled to the collectors of transistors $Q_1$ and $Q_2$ is a means for isolating the differential input stage from the output signal. In the present embodiment, such means comprises a conventional common base stage having wide-band near unity current gain. The common base stage includes a pair of opposed transistors $Q_3$ and $Q_4$ to whose respective bases is applied a constant base volta $V_B$. The emitters of transistors $Q_3$ and $Q_4$ are coupled to the collectors of transistors $Q_1$ and $Q_2$ respectively to pass the differential output currents $+I_{DO}$ and $-I_{DO}$ to further stages in the converter circuit. The transistor $Q_4$ isolates at its collector the voltage swing in the single-ended output signal from the voltage signal at the collector of transistor $Q_2$. This isolation minimizes the Miller effect that otherwise would develop across the collector-base junction of transistor $Q_2$. A balance is thereby maintained in the input signal voltages at the collectors of transistors $Q_1$ and $Q_2$.

As indicated, the differential output currents $+I_{DO}$ and $-I_{DO}$ sum to the differential current produced by the application of the input signal voltage across the base-emitter junctions of transistors $Q_1$, $Q_2$ and resistor $R_1$. Because of the nature of the differential signal and the input stage, differential currents $+I_{DO}$ and $-I_{DO}$ are equal but opposite in sign. These differential currents are passed from transistors $Q_3$, $Q_4$ through resistors $R_2$ and $R_3$. The resistors $R_2$ and $R_3$ alone, however, do not linearly reproduce the input signal because of the voltage lost across the base-emitter junctions of transistors $Q_1$ and $Q_2$. To compensate for that loss, PN junction means such as transistors $Q_5$ and $Q_6$ are incorporated into the circuit, matched to transistors $Q_1$ and $Q_2$, respectively. The emitters of transistors $Q_5$ and $Q_6$ are serially connected to the resistors $R_2$ and $R_3$, respectively, to reproduce the voltage across the base-emitter junctions of transistors $Q_1$ and $Q_2$. The differential currents $+I_{DO}$ and $-I_{DO}$ now flow through the base-emitter junctions of transistors $Q_5$ and $Q_6$ as well as the resistors $R_2$ and $R_3$. The junctions produce a compensating signal voltage substantially equal to the signal voltage lost across the base-emitter junctions of transistors $Q_1$ and $Q_2$. With the addition of transistors $Q_5$ and $Q_6$, the output signal voltage is now a linear function of the differential input signal voltage. In FIG. 1, resistors $R_2$ and $R_3$ are each equal to one-half the resistance of resistor $R_1$ and therefore provide together with the base-emitter junctions of transistors $Q_5$ and $Q_6$ unity voltage gain from input to output. As will be seen in FIG. 3, other multiples of gain can be produced as well by increasing the resistance of resitors $R_2$ and $R_3$ and by adding additional PN junctions for linearization.

Figure 2:
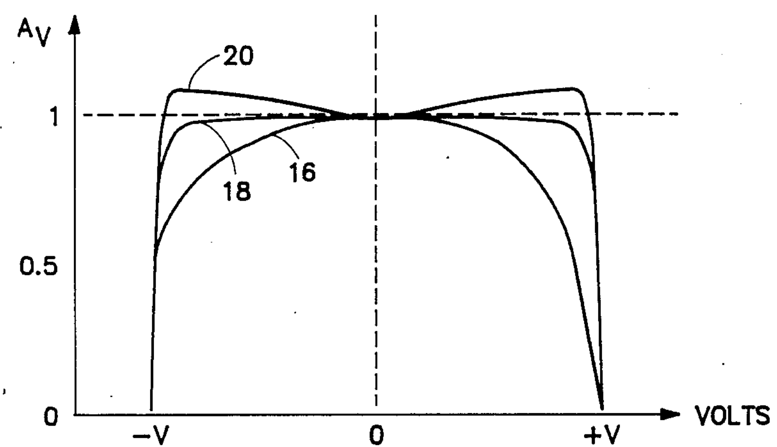
FIG. 2 is a graph of voltage gain as a function of differential input signal voltage.

FIG. 2 is a graph of voltage gain ($A_v = V_{OUT}/V_{IN}$) as a function of the input signal voltage swing across the base-emitter junctions of transistors $Q_5$ or $Q_6$. The junction is plotted from a $-V$, where transistor $Q_1$ shuts off, to a $+V$, where transistor $Q_2$ shuts off. The innermost curve 16 shows the voltage gain $A_v$ without the presence of the base-emitter junctions of transistors $Q_5$ and $Q_6$. The gain or transfer function is compressive (less than unity) until the input signal voltage is relatively close to the DC operating point. With transistors $Q_5$ and $Q_6$ present in the converter circuit, the gain is linear over a greater range as indicated by the middle curve 18. The voltage gain may also be made expansive (greater than unity) as indicated by line 20 to compensate for compression in circuits preceding the converter circuit. Means for so adjusting the compensating voltage produced across the transistors $Q_5$ and $Q_6$ comprise in FIG. 1 a variable voltage source $V_{LIN}$ for applying voltage across resistors $R_9$ and $R_{10}$ to produce currents $I_{LIN}$. These currents are directed into the emitter-collector couplings of transistors $Q_1$, $Q_3$ and $Q_2$, $Q_4$, respectively. The collector currents $I_{DO}$ and $I_M$ of transistors $Q_1$ and $Q_2$ are fixed by the input signal voltage and the current source transistors $Q_{10}$, $Q_{11}$. The currents produced b $V_{LIN}$ thus affect the amount of current drawn through transistors $Q_5$ and $Q_6$ into the collectors of transistors $Q_3$ and $Q_4$. As the current $I_{LIN}$ is increased, the differential currents through the base-emitter junctions of transistors $Q_5$ and $Q_6$ correspondingly decrease. Similarly, as the current $I_{LIN}$ is drawn out of the emitters of transistors $Q_3$ and $Q_4$ by changing the voltage applied across resistors $R_9$ and $R_{10}$, the differential output currents drawn through these base-emitter junctions correspondingly increase. These adjusting means provide the circuit designer with the ability to fine tune the linearity of the converter circuit.

The voltages developed across resistor $R_2$ and the base-emitter junction of transistor $Q_5$ by $+I_{DO}$ must be inverted to add to rather than subtract from the voltage developed across resistor $R_3$ and the base-emitter junction of transistor $Q_6$ by $-I_{DO}$. This inversion is accomplished through the shunt feedback amplifier that includes transistor $Q_9$, whose emitter is connected to ground and whose base is connected between the collector of transistor $Q_3$ and the resistor $R_2$. The collector of transistor $Q_9$ draws current through a current limiting resistor $R_5$, which also provides base current to transistors $Q_5$ and $Q_6$. Transistor $Q_9$ with its base-emitter junction tied to a fixed voltage such as ground maintains the voltage at the collector of transistor $Q_3$ constant, forcing the voltage at the emitter of transistor $Q_5$ to vary linearly in response to a change in $+I_{DO}$. This can be seen by following the feedback loop through transistor $Q_9$. If $V_{IN}$ swings positive, for example, increased differential current $+I_{DO}$ is drawn through the collector of transistor $Q_1$, forcing the voltage on the collector of transistor $Q_3$ to decrease momentarily. This decrease in turn decreases the base-emitter junction voltage of transistor $Q_9$ and the amount of current drawn through the collector of transistor $Q_9$. The voltage on the collector of transistor $Q_9$ correspondingly rises as the collector current decreases, raising the voltage on the base of transistors $Q_5$ and $Q_6$. This rise in the base voltage raises the emitter voltage until the voltage across resistor $R_2$ increases to accommodate the increase in current $+I_{DO}$.

With the voltage across resistor $R_2$ and transistor $Q_5$ so inverted, the signal voltage measured across resistor $R_2$, transistors $Q_5$, $Q_6$, and resistor $R_3$ sums to substantially the input signal voltage between the input terminals 12 and 14. For example, with $+V_{IN}$ swinging positively and $-V_{IN}$ swinging negatively, the voltage at the collector of transistor $Q_4$ increases as $-I_{DO}$ decreases. The voltage on the base of transistor $Q_6$ rises because of the inversion at the connected base of transistor $Q_5$. This rise in the base voltage raises the emitter voltage. This in turn raises the voltage across resistor $R_3$, thus effectively adding the voltages. The result of this voltage addition appears at the collector of transistor $Q_4$ as the output voltage and causes the collector to swing from its DC operating point by that amount. The output voltage change is applied to the base of an emitter follower transistor $Q_{12}$ which provides a low output impedance for the circuit.

The inversion of the voltage signal on the base of transistor $Q_5$ also provides excellent common mode rejection for the converter circuit. If $+V_{IN}$ and $-V_{IN}$ both rise, for example, the voltage at the base of transistor $Q_5$ will increase while the voltage across the base-emitter junction of transistor $Q_6$ and resistor $R_3$ will decrease a like amount. The net result is rejection of the common mode signal and no change in the output signal voltage at the collector of transistor $Q_4$.

The transistor $Q_9$ also maintains the quiescent output voltage or DC operating point of transistor $Q_{12}$ at a predetermined voltage level, with transistor $Q_{12}$ preferably matched to transistor $Q_9$. This operating point is typically chosen to make the converter circuit compatible with other integrated circuits that may connect to the output of transistor $Q_{12}$. In the present embodiment, the DC operating voltage at the base of transistor $Q_9$ is one base-emitter junction above ground. This voltage is raised a second base-emitter junction through transistor $Q_5$ and then decreased two base-emitter junctions through transistor $Q_6$ and $Q_{12}$, respectively. This voltage path therefore places the DC output voltage of transistor $Q_{12}$ at ground. It should be understood, however, that the emitter of transistor $Q_{12}$ could be set within a range of DC operating voltages by changing the level of voltage that is applied at the emitter of transistor $Q_9$.

To improve further the linear response of the converter circuit, the transistor $Q_9$ should be operated at a constant current to eliminate error voltages caused by bias changes of the base-emitter junction of transistor $Q_9$. A source of constant current is provided by the resistor $R_5$ that is connected at one end to the collector of transistor $Q_9$. With resistor $R_4$ equal to resistors $R_2$ and $R_3$, the voltage across resistor $R_5$ is kept nearly constant by tying the collector of transistor to $Q_6$ to the junction of the emitter of a transistor $Q_7$ and resistor $R_5$. Now, the collector voltage of transistor $Q_9$ and the base voltage of transistor $Q_5$ rise by a voltage equal to:

$$\Delta V = \Delta I_{DO}(R_2) + \Delta V_{BE} \text{ of transistor } Q_5 \quad (1)$$

in response to an increase in $+I_{DO}$. Current from the collector of transistor $Q_6$ ($-I_{DO}$) decreases a like amount in response to the input signal, causing the voltage across transistor $Q_7$ and resistor $R_4$ to decrease by:

$$-\Delta V = -\Delta I_{DO}(R_4) + \Delta V_{BE} \text{ of transistor } Q_7 \quad (2)$$

Therefore, the voltage applied across resistor $R_5$ is kept nearly constant because resistor $R_4$ equals resistor $R_2$ and $-I_{DO}$ is equal but opposite to $+I_{DO}$. The current provided by the resistor $R_5$ to transistor $Q_9$ is therefore constant.

Thermal distortion from the self-heating of the converter circuit also affects voltages and currents therein. Distortion due to simultaneous changes in voltage and current tends to be nonlinear; distortion due to only a voltage on a current change, however, tends to be linear. In the converter circuit, transistors $Q_9$ and $Q_{12}$ produce linear distortion because both operate at constant current. Also, transistors $Q_5$ and $Q_6$ are significant sources of distortion because the differential currents $+I_{DO}$ and $-I_{DO}$ vary as they flow through these transistors in generating the output voltage. This distortion can be made proportional to current by "bootstrapping" transistors $Q_5$ and $Q_6$ to force the collector-base junction of each transistor to be constant. Such bootstrapping is provided for transistor $Q_6$ by connecting its collector to one end of resistor $R_5$ (across which the voltage is constant) and its base to the other end. For transistor $Q_5$, bootstrapping is provided by transistors $Q_7$ and $Q_8$. Transistor $Q_8$ is tied to the supply voltage $V_{CC}$ and establishes the collector voltage of transistor $Q_5$. Transistor $Q_7$ is connected as a diode in the current path from the supply voltage $V_{CC}$ at the node between resistors $R_4$ and $R_5$. The base-emitter junction of transistor $Q_7$ steps the voltage at the node up one diode drop to the base of transistor $Q_8$. The base-emitter junction of transistor $Q_8$ then reduces the voltage one diode drop so that the voltage at the collector of transistor $Q_5$ equals the voltage applied at the node between resistors $Q_4$ and $R_5$. With the voltage across the collector-base junctions of transistors $Q_5$ and $Q_6$ held constant, thermal distortion within the transistors therefore varies linearly with the differential current flowing through the respective base-emitter junctions.

This distortion is compensated for by thermal compensation means responsive to the input signal, such as the base-emitter junctions of the current source transistors $Q_{10}$ and $Q_{11}$. Transistor $Q_{10}$, for example, produces a distortion in current $+I_{DO}$ that causes the voltage across resistor $R_2$ to increase, raising the emitter voltage of transistor $Q_5$. Simultaneously, the increased heating of transistor $Q_5$ produces a distortion in current $+I_{DO}$ that decreases the emitter voltage a like amount. The thermal distortions are thus of opposite phase and can be made to offset each other. Resistor $R_8$ is a variable resistor or a resistor with a preselected resistance connected between the emitters of transistors $Q_{10}$ and $Q_{11}$ to vary the impedance and thus the amount of thermal distortion generated therein. As a variable resistor it may be adjusted, for example, to account for thermal distortion elsewhere in the circuit such as by the base-emitter junctions of transistors $Q_9$ and $Q_{12}$.

Figure 3:
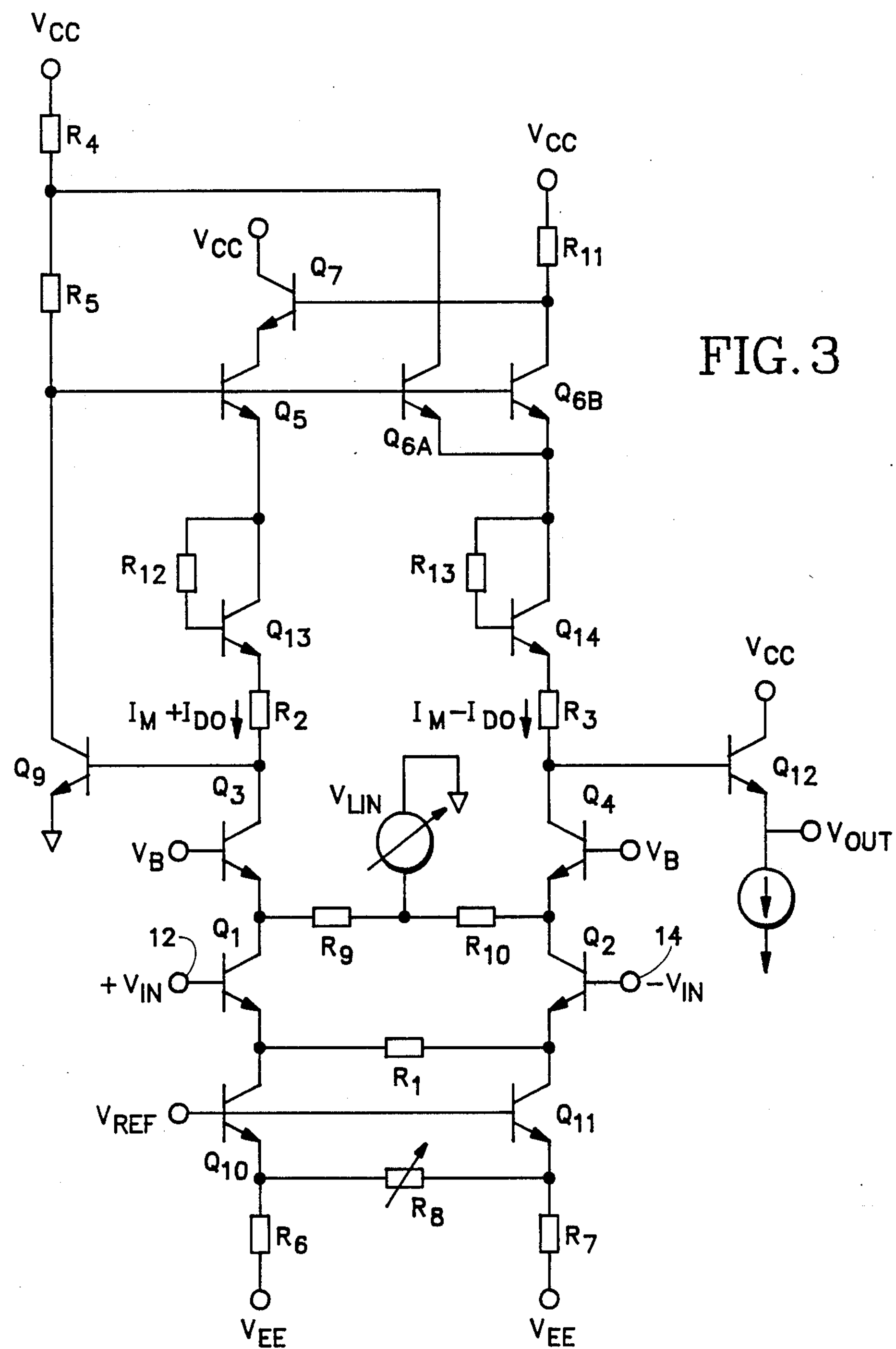
FIG. 3 is a schematic diagram of a differential to single-ended circuit similar to that in FIG. 1 with additional components added for higher gain and improved linearity.

FIG. 3 shows a second embodiment of the circuit 10 where the gain is doubled. Like reference symbols are retained in FIG. 3 for like components of FIG. 1. Resistors $R_2$ and $R_3$ have twice the value as they do in FIG. 1. Twice the PN junction compensation is required to double the voltage lost across the base-emitter junctions of transistors $Q_1$ and $Q_2$. Additional linearizing PN junctions of transistors $Q_{13}$ and $Q_{14}$ are included for this purpose. Resistors $R_{12}$ and $R_{13}$ are also included to compensate for $\alpha$ losses in transistors $Q_1$ through $Q_4$, making the gain of the converter less dependant on transistor $\alpha$. Transistor $Q_6$ is split into two transistors $Q_{6A}$ and $Q_{6B}$ for isolating the bootstrapping of transistor $Q_5$ from the feedback to transistor $Q_9$. This change in the bootstrapping allows for greater freedom in establishing the DC operating conditions of the shunt feedback stage. Transistor $Q_{6B}$ is now biased by a separate means comprising supply voltage $V_{CC}$ and resistor $R_{11}$.

Having illustrated and described the principles of the invention in preferred embodiments, it should be apparent to those skilled in the art that the invention can be modified in arrangement and detail without departing from such principles. For example, the present invention may be fabricated as an integrated circuit or as a discrete circuit.

I claim all modifications coming within the spirit and scope of the following claims:

1. A circuit for converting a differential input signal to a single ended output signal comprising:

a differential input stage including PN junctions therein;

means coupled to the input stage for isolating the input stage from the output signal to minimize Miller effect in the input stage;

PN junction means matched to the PN junctions of the input stage and coupled to the isolating means for causing the output signal to vary linearly with the input signal, the PN junction means adapted to produce a voltage to compensate for input signal voltage lost across the PN junctions within the differential input stage; and means for adjusting the compensation voltage produced across the PN junction means.

2. The circuit of claim 1 in which:

the input stage includes a pair of opposed transistors, each transistor having a base, a collector, and an emitter;

the isolating means comprises a common base stage having a pair of opposed transistors, each transistor having a base, a collector, and an emitter, the emitter of one common base stage transistor coupled to the collector of one input stage transistor and the emitter of the other common base stage transistor coupled to the collector of the other input stage transistor; and the adjusting means comprises a variable voltage source and resistor coupled to each emitter-collector coupling between the common base and input stages, the voltage source adjustable to vary the current drawn through the common base stage.

3. A circuit for converting a differential input signal to a single-ended output signal comprising:

a differential input stage including PN junctions therein;

means coupled to the input stage for isolating the input stage from the output signal;

PN junction means for causing the output signal to vary linearly with the input signal, the PN junction means adapted to produce a voltage to compensate for input signal voltage lost across the PN junctions within the differential input stage;

bootstrapping means for modifying thermal distortion generated by the PN junction means to vary linearly with the input signal; and thermal compensation means responsive to the input signal for generating thermal distortion of equal magnitude but opposite in phase with the thermal distortion of the PN junction means to cancel the distortion thereof.

4. The circuit of claim 3 in which the thermal compensation means is adjustable to compensate for other sources of thermal distortion which vary linearly with the input signal within the circuit.

5. The circuit of claim 3 in which the thermal compensation means comprises a pair of transistors providing current for the differential input stage and a resistor coupled between the emitters of the transistors, the transistors having PN junctions matched to the PN junction means.

6. The circuit of claim 3 in which the PN junction means comprises a transistor and the bootstrapping means is adapted to maintain a constant collector-base voltage across the transistor.

7. A circuit for converting a differential input signal to a single-ended output signal comprising:

a differential input stage for receiving two input signals comprising the differential input signal;

means coupled to the input stage for isolating the input stage from the output signal to minimize Miller effect in the input stage; and amplifier means coupled through the isolating means to the input stage for inverting one of the input signals to be summed with the other input signal to form the output signal with the common mode signal of the two input signals being rejected from the output signal.

8. The circuit of claim 7 in which the amplifier means comprises a transistor connected to the input stage in a shunt feedback loop.

9. The circuit of claim 7 including means for maintaining a constant current into the amplifier means to avoid the generation of error voltages in the output signal otherwise caused by a change in voltage across the amplifier in response to a current change therethrough.

* * * * *